United States Patent [19]

Herron et al.

[11] Patent Number: 4,627,160

[45] Date of Patent: Dec. 9, 1986

[54] METHOD FOR REMOVAL OF CARBONACEOUS RESIDUES FROM CERAMIC STRUCTURES HAVING INTERNAL METALLURGY

[75] Inventors: Lester W. Herron, Hopewell Junction; Ananda H. Kumar; Raj N. Master, both of Wappingers Falls; Robert W. Nufer, Hopewell Junction, all of N.Y.

[73] Assignee: International Business Machines Corporation, Armonk, N.Y.

[21] Appl. No.: 761,713

[22] Filed: Aug. 2, 1985

[51] Int. Cl.$^4$ .............................................. H05K 3/46
[52] U.S. Cl. ........................................ 29/830; 29/851; 29/852; 156/89; 264/61; 427/96
[58] Field of Search .............. 427/96; 264/61; 156/89; 29/830, 851, 852

[56] References Cited

U.S. PATENT DOCUMENTS

| | | | |
|---|---|---|---|
| 2,993,815 | 7/1961 | Treptow | 427/96 |
| 4,104,345 | 8/1978 | Anderson | 264/61 |
| 4,234,367 | 11/1980 | Herron | 427/96 |
| 4,474,731 | 10/1984 | Brownlow et al. | 419/5 |
| 4,504,339 | 3/1985 | Kamehara | 264/61 |
| 4,547,625 | 10/1985 | Tosaki | 264/61 |
| 4,551,357 | 11/1985 | Takeuchi | 427/96 |

*Primary Examiner*—John D. Smith
*Attorney, Agent, or Firm*—Wolmar J. Stoffel

[57] ABSTRACT

A process for removing organic materials from an article formed from a slurry of glass and/or ceramic particles, resin binder, and a solvent for the resin binder, the process involving including in the slurry a particulate catalyst selected from the group consisting of Cu, $Cu_2O$, CuO, $Cu_2SO_4$, $CuCl_2$, Cu organometallic compounds, and mixtures thereof, the catalyst promoting a rapid and complete removal from the shaped article when heated of the organic materials of the slurry.

17 Claims, No Drawings

METHOD FOR REMOVAL OF CARBONACEOUS RESIDUES FROM CERAMIC STRUCTURES HAVING INTERNAL METALLURGY

TECHNICAL FIELD

This invention relates to the fabrication of glass-ceramic substrate carriers for mounting semiconductor or integrated circuit chips, and more particularly to thick film interconnected metallurgy substrates comprised of sintered glass-ceramic insulators and a copper base conductor pattern. More particularly, the invention relates to an improved method of fabricating glass-ceramic substrate carriers that embody a high conductivity internal metallurgy system wherein an improved technique is provided for removing the resin binder from the structure without degrading the internal metallurgy system and/or the glass ceramic.

BACKGROUND ART

Because of the high package density attainable with multilevel ceramic (MLC) substrate circuit structure, it has achieved extensive acceptance in the electronics industry for the packaging of semiconductor integrated devices, and other elements; as for example, see U.S. Pat. Nos. 3,379,943 granted Apr. 23, 1968 to J. D. Breedloff, 3,502,520 granted Mar. 24, 1970 to B. Schwartz, 4,080,414 granted Mar. 21, 1978 to L. C. Anderson et al, and 4,234,367 to L. W. Herron, et al granted Nov. 18, 1980.

In general, such conventional ceramic structures are formed from ceramic green sheets which are prepared from a ceramic slurry by mixing a ceramic particulate, a thermoplastic polymer and a solvent. This mixture is then cast or doctor bladed into ceramic sheets or slips from which the solvents are subsequently volatalized to provide a coherent and self-supporting flexible green sheet. This green ceramic sheet is laminated to form a substrate which is fired to drive off and/or burn off the binder and associated organic materials, and sintered to fuse the ceramic particulates together into a densified ceramic substrate.

In the fabrication of multilayer ceramic structures, an electrical conductor forming composition is deposited by spraying, dipping, screening, etc. in patterns on prepunched green sheets, which when laminated and sintered collectively form the desired internal metallurgy structure. The component green ceramic sheets have via or feed through holes punched in them as required to achieve interconnection between layers or levels in the ultimate structure. The required number of component green sheets are stacked on each other in the required order. The stack of green sheets is then compressed or compacted at necessary temperatures and pressures to affect a bond between adjacent layers not separated by the electrical conductor forming patterns. The overall process is more completely described in "Ceramics For Packaging" by D. L. Wilcox, *Solid State Technology*, May 1972 P. 35–40.

Alumina, $Al_2O_3$, because of its excellent insulating properties, thermal conductivity, stability and strength has received wide acceptance as the material of choice for fabrication of such MLC substrates. However, for various high performance applications, the relatively high dielectric constant of alumina results in significant signal propagation delays and noise. A further disadvantage of alumina is its relatively high thermal expansion coefficient, on the order of 65 to $70 \times 10^{-7}$ per °C., as compared to monocrystalline silicon where the coefficient is from 25 to $30 \times 10^{-7}$, which difference may in certain cases result in some design and reliability concerns, particularly when a silicon chip is joined to the substrate with solder interconnections.

A particular disadvantage is the high sintering and maturing temperature of commercial alumina (about 1600° C.), which restricts the choice of co-sinterable conductive metallurgies to refractory metals, such as tungsten, molybdenum, platinum, palladium, or a combination thereof. The high sintering temperature precludes the use of metals with higher electrical conductivities such as gold, silver or copper because the latter would be molten before the sintering temperature of alumina is reached.

A multilayer glass ceramic structure is disclosed and claimed in U.S. Pat. No. 4,301,324 by A. H. Kumar et al, whose teachings are incorporated herein by reference thereto, which avoids the use of and the attendant disadvantages of alumina ceramic. The disclosed multilayer glass-ceramic structures are characterized with low dielectric constants and are compatible with thick film circuitry of gold, silver, or copper and are co-fired therewith. Of the two types of glass-ceramics disclosed in the aforementioned patent, one has β-Spodumene, $Li_2O \cdot Al_2O_3 \cdot 4SiO_2$ as the principal crystalline phase while the other has cordierite, $2MgO \cdot 2Al_2O_3 \cdot 5SiO_2$ as the main crystalline phase. A common feature of these sintered glass-ceramics is their excellent sinterability and crystallization capability below 1,000° C.

Silver can be used as a metal in such glass ceramic materials, however, it was found that silver has a tendency to cause electromigration problems and is suspected of diffusing into the glass ceramic.

Although successful glass-ceramic substrates have been made using gold metallurgy with a resistivity about 3.75 microhm-centimeter, gold is extremely expensive. Also, any alloying of other less expensive metals with gold would result in the disadvantage of an increase in resistivity. This limits the choice to copper as a practical economic alternative.

The use of copper is relatively new in the thick film technology. Because of copper's oxidizing potential, it is necessary to sinter multilayer ceramic substrates in reducing or neutral ambients. However, since reducing ambients can present adhesion problems, neutral ambients are preferable. A typical industrial cycle to sinter thick copper films on prefired alumina substrates would be heating to raise the temperature at the rate of 50°–75° C./minute to a firing or sintering temperature in the range of 900°–950° C. with a 15 minute hold at the peak temperature followed by cooling at a rate of 50°–75° C./minute.

In the fabrication of multilevel glass-ceramic structures, difficulty has been encountered in removing the resin binders that are used to produce the slurry for processing.

With the use of glass-ceramics and copper metallurgy, the maximum temperature for binder removal, due to the coalescence of glass particles, is in the range of about 800°–875° C. Thus, after the glass has coalesced, any remaining binder residue will become entrapped in the glass body. It has also been found that nitrogen or other neutral or reducing ambients make difficult the removal of binder below the temperature of the glass coalescence, e.g. about 800°–875° C., which can result in black or darkened substrates that are not fully sintered. The black or darkened color is generally attributed to carbon residue trapped in the ceramic. The carbon residue can have an adverse affect on the electrical characteristics of the resultant substrate, as by reducing the resistivity and having an adverse affect on the dielectric constant of the material.

Various efforts have been made to alleviate complete binder removal. Some difficulties are encountered with various neutral or reducing atmospheres, which include wet and dry nitrogen, wet and dry forming gas, long holds at temperature below the coalescence temperature of glass-ceramic so as not to entrap volatile products, and alternating air and forming gas for purposes of oxidizing carbon and reducing any form of copper-oxide to copper without drastic volume changes resulting from the copper oxide formation. In addition, attempts have been made to develop a polymer binder system which would by some mechanism of fractionation (e.g. unzipping, hydrolosis, etc.) burn off without any remaining carbonaceous residue.

U.S. Pat. No. 4,234,367 by Herron et al, issued Nov. 18, 1980 discloses and claims a method of forming a glass-ceramic composite structure with a copper-based metallurgy. In this process, laminated green ceramic substrates are heated in a $H_2/H_2O$ environment to a burn-out temperature in the range between the anneal and softening point of the glass-ceramic material which temperature is less than the melting point of the copper. The conditions are sufficient to remove the binder without oxidizing the copper metallurgy. The resultant binder-free laminate is then heated in a nitrogen atmosphere to a somewhat higher temperature to coalesce the glass particles. The copper is prevented from oxidizing in this later heating phase by the inert atmosphere.

While the process is operable and effective, the binder removal heating step is quite lengthy, and carbonaceous residues may remain in the substrate. Further, the ceramic portions about the copper metallurgy may be porous. This flaw is very serious if it occurs under a surface pad which is later stressed as by bonding to a pin or other interconnection, resulting in ceramic fail due to low strength.

SUMMARY OF THE INVENTION

It has been discovered that in accordance with this invention a catalyst can be added to glass-ceramic material in a process of producing a laminate structure with internal metallurgy that will greatly facilitate removal of the binder resin during the burn-off phase. The invention is to add a catalyst such as Cu, CuO, $Cu_2O$, $CuCl_2$, $Cu_2SO_4$, or a copper organometallic to the glass-ceramic material in an amount from 0.01 to 3.0% of the Cu component of the catalyst relative to the weight of the glass. The slurry is formed by mixing together the resin binder, the catalyst, a solvent and a glass ceramic material. The slurry used to form a structure embodying an internal metallurgy system, and the structure heated in an environment adapted to remove the binder without oxidizing the metal. The binder removal is achieved in a much shorter time without leaving a carbonaceous residue, and the sintered structure is free of localized porous portions.

DISCLOSURE OF THE INVENTION

The process described and claimed in U.S. Pat. No. 4,234,367 involves heating a laminated glass-ceramic substrate embodying a conductive metallurgy, in particular copper, to initially remove the resin binder and solvent used to form the slurry. The heating is done in an $H_2/H_2O$ environment that will remove the binder resin and solvent and yet provide a neutral or reducing environment for the copper metallurgy. During the heating cycle, the glass-ceramic material must remain porous to allow for escape from the substrate of the volatilized products and by-products of the resin and solvent. If the sintering phase, which reduces porosity, begins before the binder resin is completely removed, carbonaceous residues will be trapped in the substrate. The temperature limits imposed by the use of copper requires glass ceramics that begin to sinter at or near 800° C. This then sets the maximum temperature for carbon oxidation of the binder resin because the carbon must be completely removed while the substrate is still porous. At these temperatures the oxidation rate of carbon is very slow and results in carbon oxidation hold times in excess of 10 hours. The long hold times impact furnace through-put and may result in degradation of some substrate properties.

When the substrate is subsequently exposed to the sintering cycle, which is done in an inert or reducing atmosphere, typically $N_2$, $H_2$ or forming gas and the temperature raised, the $H_2O$ absorbed by the glass-ceramic from the previous heating step must escape before it is trapped. Trapped $H_2O$ causes porosity in the substrate, which is objectionable.

We have discovered that the presence of very small amounts of a catalyst, as for example Cu, CuO, $Cu_2O$, $CuCl_2$, $Cu_2SO_4$ or a copper organometallic material in the glass-ceramic substrate during the carbon oxidation heating phase will act as a catalyst for the oxidation of the carbon and significantly increase the reaction rate. The increased oxidation rate results in hold times of 1–4 hours instead of the normal 10–12 hours. The catalyst is added in the form of a fine powder, a dissolved salt, or an organometallic compound to the glass-ceramic slurry.

The unique way in which this catalyst works allows its concentration to be very low, typically from 10 to 30,000 parts/million, or 0.01–3.0% by weight of the glass-ceramic.

The Cu catalyst in the green ceramic substrate during the binder burnoff phase acts as an oxidation catalyst for the organic binder. Due to the catalytic action, the oxidation rate of the organic binder residue is greatly accelerated. In the process of the invention, the binder removal rate and the subsequent densification of the copper catalyzed glass ceramic substrate will be uniform throughout so that the sintering process can be optimized.

The enhanced resin burn-off rate achieved in this invention is, in general, applicable to all types of ceramics that must be sintered. However, it is particularly valuable to glass-ceramics that sinter at relatively low temperatures, since it is these ceramics that present significant problems in binder removal. For applications where a high sintering temperature is necessary, i.e., alumina, the metal used in the metallurgy system is largely restricted to refractory metal since only they will withstand the high temperatures. With these high sintering temperatures, greater than 1500° C., the complete burn-off of the binder resin generally presents no significant problems. However, with glass-ceramics, a much lower burn-off temperature is used which results in a slow and sometimes incomplete burn-off of the resin. Any ceramic material can be used in the process of this invention since the burn-off rate is increased for all. However, practice of the invention is particularly applicable to glass-ceramics. Any glass-ceramic material can be used. Of particular interest are the glass-ceramics described in U.S. Pat. No. 4,301,324 which consists of glasses of the β-Spodumene type, and of the cordierite type. β-Spodumene, has $Li_2O \cdot Al_2O_3 \cdot 4SiO_2$ as the principal crystalline phase, while cordierite, has $2MgO \cdot 2Al_2O_3 \cdot 5SiO_2$ as the main crystalline phase. A common feature of these sintered glass-ceramics apart from their excellent sinterability below 1,000° C. is a microstructure that can be described as composed of networks that are highly crystalline, the interstices of which are occupied by small amounts of residual glass and some discrete secondary crystallites. Such microstructures differ from those observed in bulk glass-ceramics in that in the latter the glassy phase forms a matrix or the network with discrete crystallites dispersed in it. We believe that the unique microstructures observed in glass-ceramics of this invention give rise to their high flexual strength. Glass-ceramics of the aforementioned types are characterized in the following table:

TABLE I

| | Composition Ranges (Weight Percentages) | |
|---|---|---|
| | β-Spodumene Type | Cordierite Type |
| $SiO_2$ | 65 to 75 | 48 to 55 |
| $Al_2O_3$ | 12 to 17 | 18 to 23 |
| MgO | 0 to 2 | 18 to 25 |
| CaO | 0 to 2 | — |
| BaO | (alone or combined) | |
| ZnO | 0 to 2 | 0 to 2 |
| $Li_2O$ | 3.5 to 11 | 0 to 1 |
| $Na_2O$ | 1.0 to 3.5 | — |
| $K_2O$ | (alone or combined) | — |
| $B_2O_3$ | 0 to 2.5 | 0 to 3 |
| $P_2O_5$ | 0 to 2.5 | 0 to 3 |
| $TiO_2$ | 0 to 3 | 0 to 2.5 |
| $SnO_2$ | | 0 to 2.5 Total |
| $ZrO_2$ | | 0 to 2.5 exceed |
| F | 0 to 3 | — 5.0 |

Any suitable binder resin and solvent combinations can be used in the practice of this invention. Also, it is to be understood that the conditions for binder burn-off and sintering can be adapted to the particular glass-ceramic used in the practice of the invention.

The following examples are presented to illustrate preferred specific embodiments of the practice of the method of the invention and they should not be construed to unduly restrict the scope of claims.

EXAMPLE I

This example dramatically demonstrates the effectiveness of resin binder removal at low temperatures from a laminated glass ceramic material embodying a Cu catalyst.

A quantity of a particulate glass ceramic powder was prepared from a cullet of glass with a −325 mesh particle size. The glass cullet was composed of MgO. $Al_2O_3.SiO_2$ type glass ceramic which is disclosed in U.S. Pat. No. 4,301,324. The cullet was ground reducing the average particle size to arrange between 3–7 μm. The cullet was divided into first and second portions, and $Cu_2O$ powder added to the first portion such that the Cu was present in 1500 ppm by weight of glass ceramic. First and second slurries were prepared from each of the first and second portions of the glass cullet having the following composition:

| | % by Weight |
|---|---|
| Glass | 55 |
| Polyvinyl butyral resin | 5 |
| Dipropylene glycol dibenzoate | 1.5 |
| Methanol | 9.5 |
| Methyl isobutyl ketone | 29 |
| | 100 |

The slurry mixtures were cast and dried into sheets having a thickness of 8 mils. The green ceramic sheets were kept carefully separated, i.e. the sheets containing the $Cu_2O$ catalyst, and the sheets without catalyst. Several laminated substrates were prepared from the green ceramic sheets. The substrates were prepared by assembling 5 sheets of uncatalyzed material, adding 5 sheets of catalyzed material, and continuing until a total thickness of 320 mils (40 sheets) was built up. The substrates, having alternating layers ∼40 mils in thickness of catalyzed and uncatalyzed layers were heated by the method described and claimed in U.S. Pat. No. 4,234,367. The substrates were pre-heated for about 1½ hours in an ambient of $N_2$. During this preheating, the temperature was raised from room temperature to a temperature of about 200° C. where the temperature rise was about 2° C./min. The nitrogen was then replaced with a $H_2/H_2O$ ambient in a volume ratio of $10^{-6.5}$. The heating continued to about 450° C. at which point the rate of heating was increased to about 3° C./min. The heating was continued to a hold temperature of 785° C. This temperature was held for 6 hours, and then dropped to room temperature. After the substrates had cooled to room temperature, they were examined. The substrates all exhibited alternating black and substantially white stripes on the edges. The black stripes corresponded to the volume of the substrate formed of uncatalyzed green ceramic sheets. In contrast the white stripes corresponded to volumes of the substrate formed of green ceramic sheets containing $Cu_2O$ catalyst in the glass ceramic material. The dark brown color was caused by unburned carbon residue remaining after the heating. The color contrast between the catalyzed and uncatalyzed green sheets dramatically illustrates the relative ease of binder resin removal when using a Cu catalyst in the ceramic.

EXAMPLE II

An entire multi-level ceramic substrate was formed of sheets formed of slurry with $Cu_2O$ catalyst as described in Example I. An internal conductive metallurgy pattern was formed of particulate Cu particles in a vehicle that was screened in the appropriate pattern on each sheet after it was punched to form via holes. The laminated sheet was heated in the manner described in Example I, and subsequently, without cooling, heated in an $N_2$ ambient at 965° C. for 3 hours. The last heating step sintered the glass ceramic particles into a dense mass without adversely affecting the internal Cu metallurgy. After cooling the substrate was inspected and found to have a uniform pink color due to the coloring of the Cu catalyst. The Cu lines were visible when the substrate was sectioned. The lines were bright in color without evidence of any oxidation. The resistivity of the sintered ceramic was measured and found to be $>10^{13}$ ohm-cm. The pink color indicated the complete removal of the resin binder and associated organic materials.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. In a method of forming a glass-ceramic composite substrate wherein a slurry is prepared which includes sinterable particles of a crystallizable glass, an organic resin binder, and a solvent for the binder, forming the slurry into green ceramic sheets, forming via holes in the sheets, depositing electrically conductive material in the via holes and in line patterns on the surface of the sheets, assembling the sheets, and heating the assembly in an environment to oxidize and remove the resin binder, and subsequently heating the assembly at a higher temperature to fuse the glass particles, the improvement comprising, incorporating a catalyst to accelerate the binder oxidation of said slurry and eliminate carbonaceous binder residue, said catalyst selected from the group consisting of fine particles of Cu, $Cu_2O$, CuO, $Cu_2SO_4$, $CuCl_2$, Cu- organometallic compounds and mixtures thereof, in an amount in the range of 0.01 to 3.0% by weight of the said crystallizable glass, said catalyst capable of accelerating the oxidation and removal of said binder during said heating in the oxidizing environment.

2. The method of claim 1 wherein said catalyst is Cu.

3. The method of claim 1 wherein said catalyst is CuO.

4. The method of claim 1 wherein said catalyst is $Cu_2O$.

5. The method of claim 1 wherein said catalyst is $Cu_2SO_4$.

6. The method of claim 1 wherein said catalyst is $CuCl_2$.

7. The method of claim 1 wherein said catalyst is Cu organometallic compounds.

8. The method of claim 1 wherein said electrically conductive material is Cu.

9. The method of claim 1 wherein said composite substrate is a multilayer ceramic substrate adapted for use in an electronic package.

10. The method of claim 1 wherein the initial heating of the assembly is controlled to oxidize the resin binder but not the electrically conductive material.

11. The method of claim 1 wherein the initial heating of the composite substrate is done in a steam and H2 atmosphere at a temperature less than the melting point of said electrically conductive material.

12. The method of claim 11 wherein said electrically conductive material is Cu or an alloy thereof.

13. The method of claim 12 wherein the hydrogen to $H_2O$ ratio is in the range of $10^{-4}$ to $10^{-6.5}$.

14. The method of claim 13 wherein the temperature range of said initial heating is in the range of 720° to 85° C.

15. In a method of forming a composite substrate wherein a slurry is prepared which includes sinterable particles of a particulate inorganic material, an organic resin binder, and a solvent for the binder, forming the slurry into green sheets, forming via holes in the sheets, depositing electrically conductive material in the via holes and in line patterns on the surface of the sheets, assembling the sheets, and heating the assembly to oxidize and remove the resin binder and to fuse the particles of inorganic material, the improvement comprising, incorporating a catalyst to accelerate the binder oxidation of said slurry and eliminate carbonaceous binder residue, said catalyst selected from the group consisting of fine particles of Cu, $Cu_2O$, CuO, $Cu_2SO_4$, $CuCl_2$, Cu organometallic compounds and mixtures thereof, said catalyst capable of accelerating the oxidation and removal of said binder during said heating.

16. The method of claim 15 wherein said catalyst is present in an amount in the range of 0.01 to 3.0% by weight of said particulate organic material.

17. The method of claim 15 wherein said assembly of sheets is initially heated in an environment to oxidize and remove the resin binder, and subsequently heated at a higher temperature to fuse the particles of said particulate inorganic material.

* * * * *